United States Patent
Mazza et al.

(10) Patent No.: US 12,424,493 B2
(45) Date of Patent: Sep. 23, 2025

(54) SELF-ALIGNED DOUBLE PATTERNING WITH MANDREL MANIPULATION

(71) Applicant: GlobalFoundries U.S. Inc., Malta, NY (US)

(72) Inventors: James Mazza, Saratoga Springs, NY (US); David Pritchard, Glenville, NY (US); Romain Feuillette, Williston, VT (US); Elizabeth Strehlow, Cleveland, GA (US); Hongru Ren, Mechanicville, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 536 days.

(21) Appl. No.: 17/985,487

(22) Filed: Nov. 11, 2022

(65) Prior Publication Data

US 2024/0162090 A1    May 16, 2024

(51) Int. Cl.
*H10D 84/03* (2025.01)
*H01L 21/768* (2006.01)
*H01L 23/522* (2006.01)
*H01L 23/528* (2006.01)
*H10D 84/01* (2025.01)
*H10D 84/85* (2025.01)

(52) U.S. Cl.
CPC .... *H01L 21/76897* (2013.01); *H01L 23/5226* (2013.01); *H01L 23/528* (2013.01); *H10D 84/0186* (2025.01); *H10D 84/038* (2025.01); *H10D 84/85* (2025.01)

(58) Field of Classification Search
CPC .... H10D 84/83; H10D 84/0149; H10D 89/10; H10D 84/0172; H10D 84/0135
See application file for complete search history.

(56) References Cited

U.S. PATENT DOCUMENTS

| | | | |
|---|---|---|---|
| 8,779,510 B2 | 7/2014 | Yilmaz et al. | |
| 8,863,063 B2 | 10/2014 | Becker et al. | |
| 9,224,617 B2 | 12/2015 | Pritchard et al. | |
| 9,355,912 B2 | 5/2016 | Wu et al. | |
| 2020/0105910 A1* | 4/2020 | Yeong | H10D 30/024 |
| 2022/0157960 A1* | 5/2022 | Cho | H10D 64/519 |

* cited by examiner

*Primary Examiner* — Fernando L Toledo
*Assistant Examiner* — Adam S Bowen
(74) *Attorney, Agent, or Firm* — Thompson Hine LLP; David Cain

(57) ABSTRACT

Structures with features formed by self-aligned double patterning and methods of self-aligned multiple patterning. The structure comprises a first field-effect transistor including a first gate and a first protrusion projecting laterally from the first gate, and a second field-effect transistor including a second gate and a second protrusion projecting laterally from the second gate. The second gate and the second protrusion are spaced in a lateral direction from the first gate and the first protrusion. The structure further comprises a gate contact connecting the first protrusion of the first gate to the second protrusion the second gate.

20 Claims, 9 Drawing Sheets

SELF-ALIGNED DOUBLE PATTERNING WITH MANDREL MANIPULATION

BACKGROUND

The disclosure relates to semiconductor device fabrication and integrated circuits and, more specifically, to structures with features formed by self-aligned double patterning and methods of self-aligned double patterning.

Self-aligned double patterning processes may be used to form features of an integrated circuit. A self-aligned patterning process relies on the use of sacrificial mandrels to establish a feature pitch and arrangement. Spacers are formed adjacent to the sidewalls of the mandrels, and the mandrels are subsequently removed such that the spacers can be used as an etch mask to etch a pattern into an underlying hardmask. The pattern is subsequently transferred from the hardmask to an underlying layer of material in order to form the features of the integrated circuit.

Improved structures with features formed by self-aligned double patterning and methods of self-aligned multiple patterning are therefore needed.

SUMMARY

In an embodiment of the invention, a structure comprises a first field-effect transistor including a first gate and a first protrusion projecting laterally from the first gate, and a second field-effect transistor including a second gate and a second protrusion projecting laterally from the second gate. The second gate and the second protrusion are spaced in a lateral direction from the first gate and the first protrusion. The structure further comprises a gate contact connecting the first protrusion of the first gate to the second protrusion the second gate.

In an embodiment of the invention, a method comprises forming a mandrel on a gate stack, patterning a notch extending from a first sidewall of the mandrel partially across a width of the mandrel, and forming a spacer adjacent to the first sidewall of the mandrel and a second sidewall of the mandrel. The notch is filled by a dielectric material of the spacer. The method further comprises patterning the gate stack using the spacer and the dielectric material in the notch as an etch mask to respectively form a gate and a protrusion projecting laterally from a sidewall of the gate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals are used to indicate like features in the various views.

DETAILED DESCRIPTION

Figure 1:
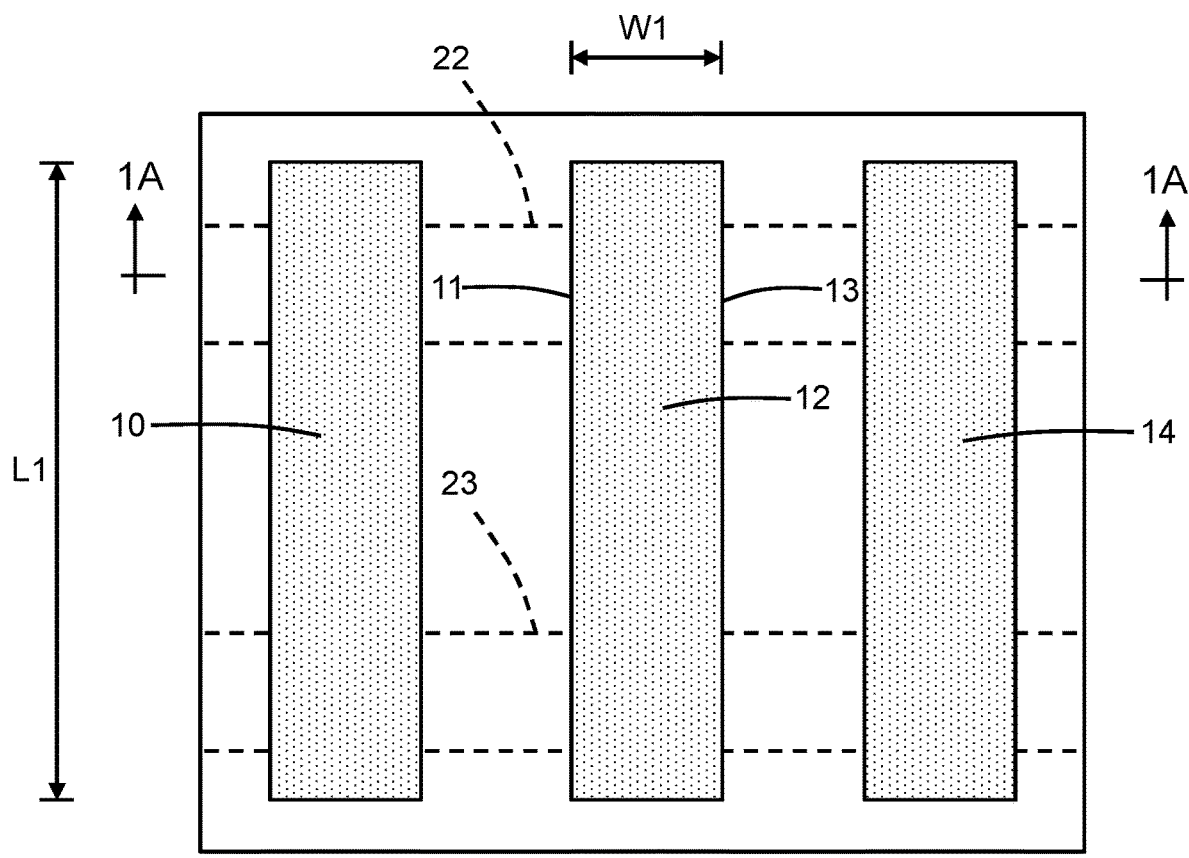
FIG. 1 is a top view of a structure at an initial fabrication stage of a processing method in accordance with embodiments of the invention.
Figure 1A:
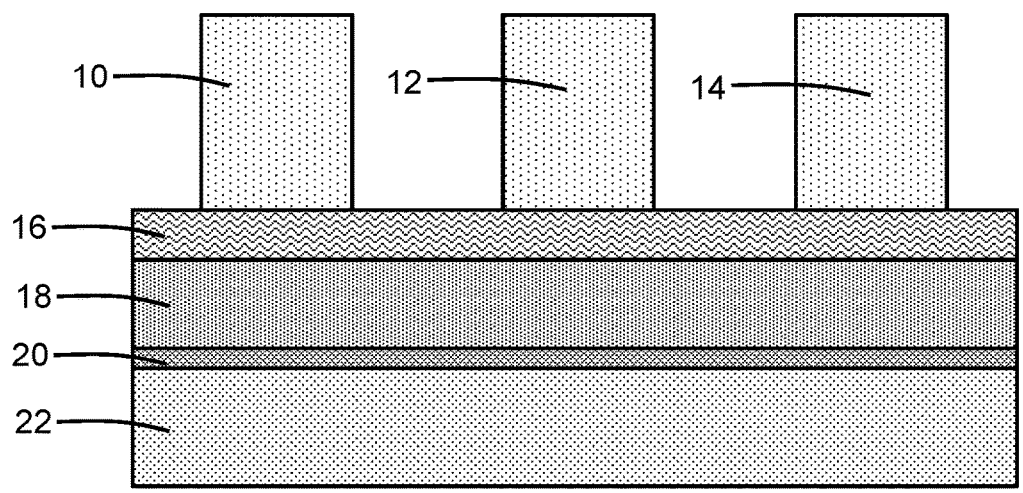
FIG. 1A is a cross-sectional view taken generally along line 1A-1A in FIG. 1.

With reference to FIGS. 1, 1A and in accordance with embodiments of the invention, mandrels 10, 12, 14 may be formed on a top surface of a hardmask 16. The hardmask 16 is positioned on a layer stack including a layer 18 comprised of a conductor, such as doped polysilicon, and an underlying layer 20 comprised of a dielectric material, such as silicon dioxide, that is an electrical insulator. The mandrels 10, 12, 14 may be formed from a layer of material, such as amorphous silicon, amorphous carbon, or a spin-on hardmask, that is deposited and patterned with lithography and etching processes. Each of the mandrels 10, 12, 14 has a length L and a width W1 in a direction transverse to the length L. In an embodiment, the mandrels 10, 12, 14 may be longitudinally aligned parallel to each other. The hardmask 16 and the layer stack including the layers 18, 20 may cover the active device regions 22, 23. The active device regions 22, 23 may be portions of a planar semiconductor substrate or, alternatively, semiconductor fins, and the active device regions 22, 23 may be comprised of a semiconductor material, such as silicon. The active device regions 22, 23 may be surrounded by shallow trench isolation regions comprised of, for example, silicon dioxide.

Figure 2:
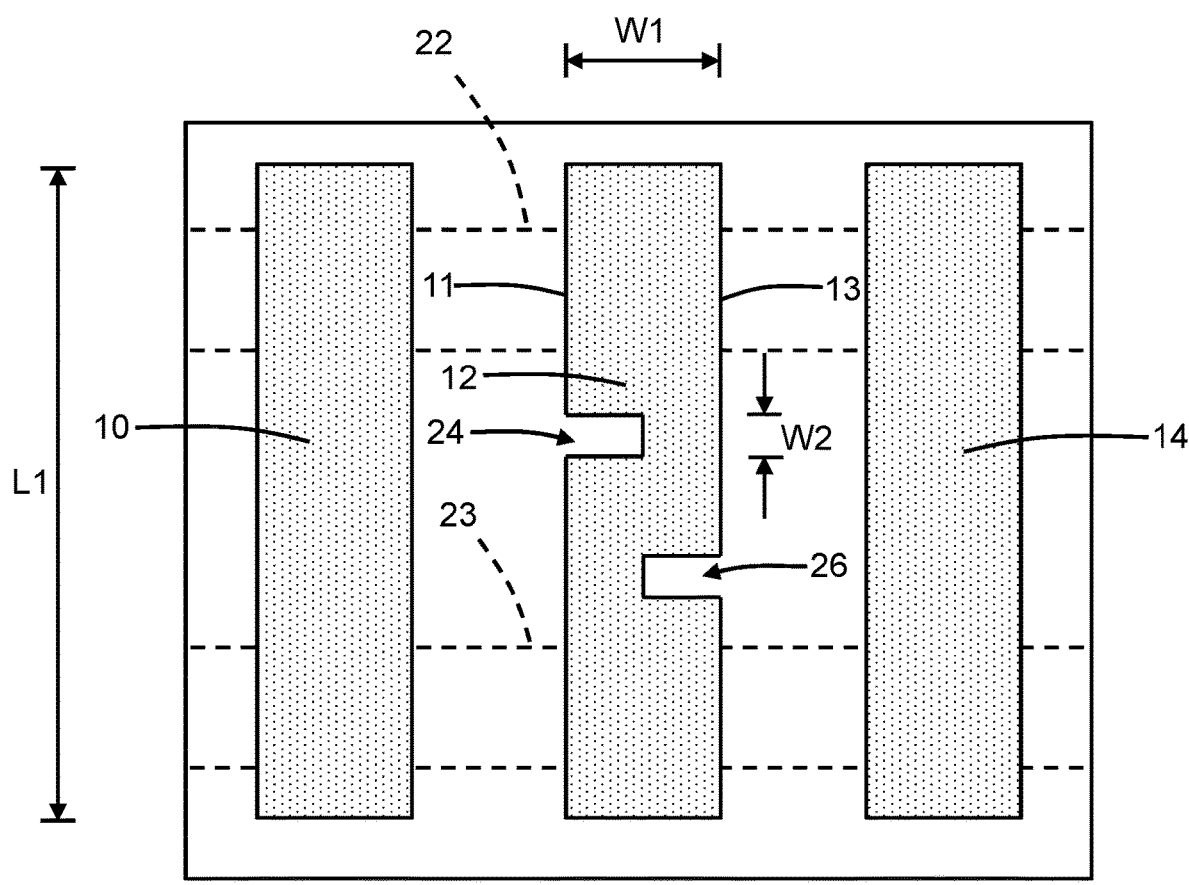
FIG. 2 is a top view of the structure at a fabrication stage subsequent to FIG. 1.

With reference to FIG. 2 in which like reference numerals refer to like features in FIGS. 1, 1A and at a subsequent fabrication stage, a notch 24 and a notch 26 are patterned by an etching process in the mandrel 12 using a lithographically-formed mandrel cut mask. The mandrel cut mask may include openings defined at the intended locations of the notches 24, 26, and the notches 24, 26 may be formed at the locations of the openings by the etching process. The notch 24, which defines an indentation in a sidewall 11 of the mandrel 12, extends inward from the sidewall 11 toward an opposite sidewall 13 of the mandrel 12. The notch 26, which defines an indentation in the sidewall 13 of the mandrel 12, extends inward from the sidewall 13 toward the opposite sidewall 11. Each of the notches 24, 26 extends partially across the width W1 of the mandrel 12. Each of the notches 24, 26 has a width W2 and a depth that is a fraction of the width W1 of the mandrel 12, and the notches 24, 26 are longitudinally positioned along the length L of the mandrel 12 in a space between the active device region 22 and the active device region 23. In an embodiment, the notches 24, 26 may be rectangular indentations that extend inwardly from the respective sidewalls 11, 13 into the mandrel 12.

Figure 3:
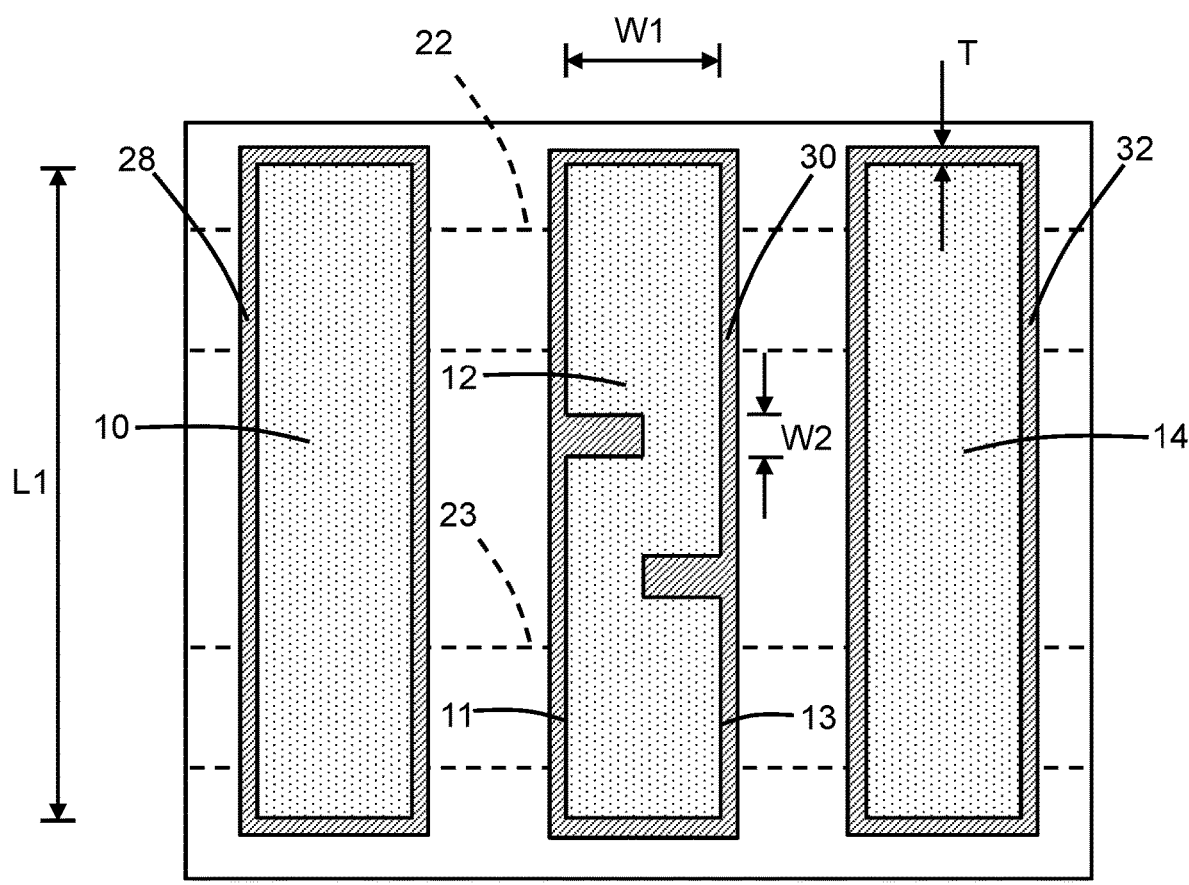
FIG. 3 is a top view of the structure at a fabrication stage subsequent to FIG. 2.

With reference to FIG. 3 in which like reference numerals refer to like features in FIG. 2 and at a subsequent fabrication stage, spacers 28, 30, 32 are formed on the mandrels 10, 12, 14. The spacers 28, 30, 32 may be formed by depositing a layer comprised of a dielectric material, such as titanium oxide or silicon dioxide, and etching the deposited layer with an anisotropic etching process. The dielectric material of the spacer 30 may fill the notch 24 (FIG. 3) in the sidewall 11 of the mandrel 12 and the notch 26 (FIG. 3) in the opposite sidewall 13 of the mandrel 12. In an embodiment, the dielectric material of the spacer 30 may merge and fully fill the notches 24, 26. In an embodiment, the width W2 of the notches 24, 26 may be selected to be less than or equal to twice the thickness T of the spacers 30. The manipulation of the mandrel 12 through the addition of the notches 24, 26 promotes an increase in the complexity of the layout construct.

Figure 4:
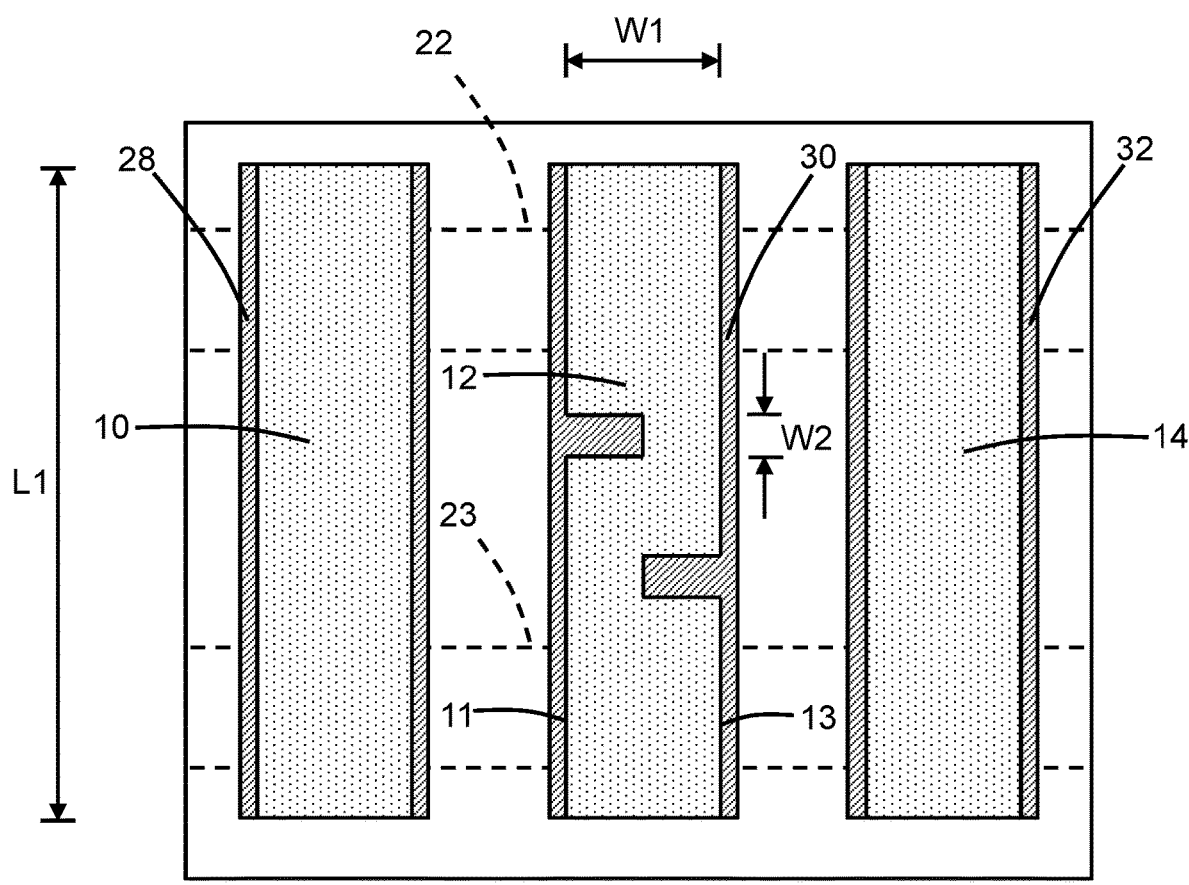
FIG. 4 is a top view of the structure at a fabrication stage subsequent to FIG. 3.

With reference to FIG. 4 in which like reference numerals refer to like features in FIG. 3 and at a subsequent fabrication stage, the spacers 28, 30, 32 may be cut at the opposite ends of the mandrels 10, 12, 14 to generate discontinuities. The spacer 28 is divided into a pair of sections located at the opposite sidewalls of the mandrel 10, the spacer 30 is divided into a pair of sections located at the opposite sidewalls 11, 13 of the mandrel 12, and the spacer 32 is divided into a pair of sections located at the opposite sidewalls of the mandrel 14. The dielectric material inside the notch 24 is located in one section of the spacer 30, and the dielectric material inside the notch 26 is located in the other section of the spacer 30.

Figure 5:
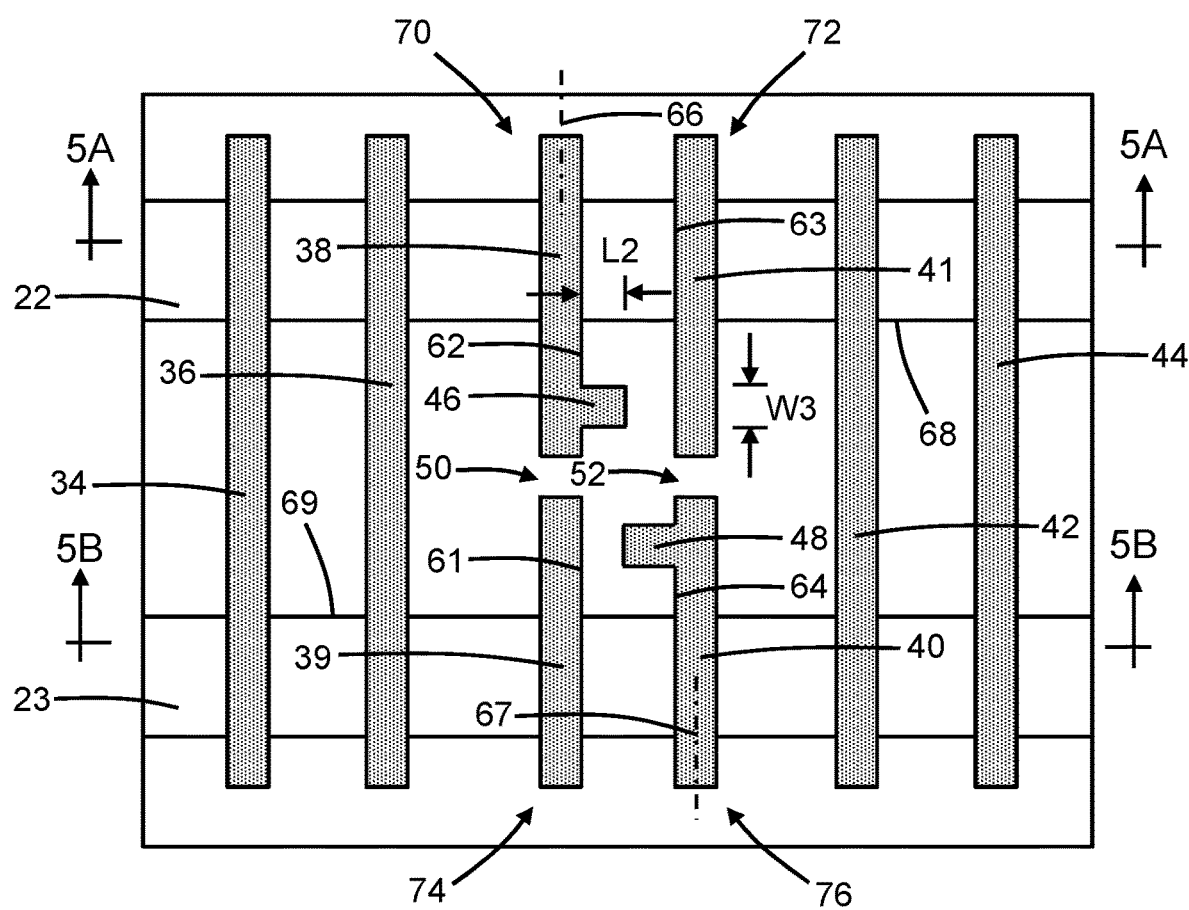
FIG. 5 is a top view of the structure at a fabrication stage subsequent to FIG. 4.
Figure 5A:
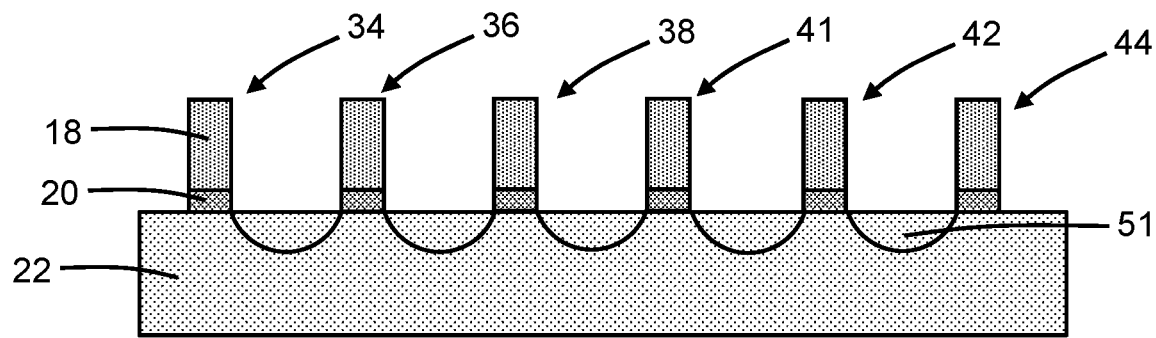
FIG. 5A is a cross-sectional view taken generally along line 5A-5A in FIG. 5.
Figure 5B:
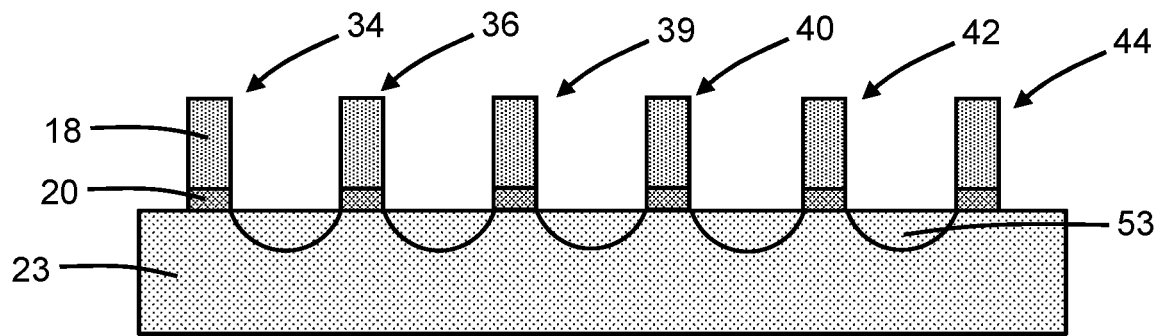
FIG. 5B is a cross-sectional view taken generally along line 5B-5B in FIG. 5.

With reference to FIGS. 5, 5A, 5B in which like reference numerals refer to like features in FIG. 4 and at a subsequent fabrication stage, the mandrels 10, 12, 14 are removed by an etching process that etches the material constituting the mandrels 10, 12, 14 selective to the material constituting the spacers 28, 30, 32. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process. In an embodiment, the mandrels 10, 12, 14 may be fully removed from the spaces between the sections of the spacers 28, 30, 32.

Gates 34, 36, gates 38, 40, gates 39, 41, and gates 42, 44 are formed by transferring the pattern embodied in the spacers 28, 30, 32 with one of more etching processes to pattern the hardmask 16 and then to pattern the layers 18, 20 of the layer stack. The spacers 28, 30, 32 and the patterned hardmask 16 may be removed after patterning the layers 18, 20 of the layer stack. Each of the gates 34, 36, gates 38, 40, gates 39, 41, and gates 42, 44 includes a stacked section of the conductor layer 18 and the dielectric layer 20. The gates 38, 40 and the gates 39, 41 are positioned in a lateral direction between the gates 34, 36 and the gates 42, 44. In an embodiment, the gate 38 may be included in a field-effect transistor 70, the gate 41 may be included in a field-effect transistor 72, the gate 39 may be included in a field-effect transistor 74, and the gate 40 may be included in a field-effect transistor 76.

The gates 38, 39 and the gates 40, 41 have respective shapes that reflect the shape of the spacer 30, which provides the pattern used for their formation. The gate 38 includes a stub or protrusion 46 at the former location of the dielectric material of the spacer 30 inside the notch 24. The gate 40 includes a stub or protrusion 48 at the former location of the dielectric material of the spacer 30 inside the notch 26. The protrusion 46 projects laterally outward from a sidewall 62 of the gate 38. The protrusion 48 projects laterally outward from a sidewall 64 of the gate 40. The protrusions 46, 48 project in a lateral direction into a space between the sidewall 62 of the gate 38 and the sidewall 64 of the gate 40. The protrusion 46 is separated from a directly adjacent sidewall 63 of the gate 41 by a space. The protrusion 48 is separated from a directly adjacent sidewall 61 of the gate 39 by a space.

An end of the gate 38 is spaced from an end of the gate 39 by a discontinuity or gap 50 and an end of the gate 40 is spaced from an end of the gate 41 by a discontinuity or gap 52 at the locations of gate cuts formed using a cut mask and an etching process. A portion of the gate 38, which terminates at the gap 50, is positioned between the protrusion 46 and the gap 50. A portion of the gate 40, which terminates at the gap 52, is positioned between the protrusion 48 and the gap 52. The gaps 50, 52 are both positioned between the protrusion 46 and the protrusion 48.

The gate 38 is aligned along a longitudinal axis 66, and the gate 40 is aligned along a longitudinal axis 67 that may be either parallel or substantially parallel to the longitudinal axis 66 of the gate 38. The gate 39 may be longitudinally aligned either parallel or substantially parallel to the longitudinal axis 66 of the gate 38, and the gate 41 may be longitudinally aligned either parallel or substantially parallel to the longitudinal axis 67 of the gate 40. The gate 38 extends lengthwise along the longitudinal axis 66 across a boundary 68 of the active device region 22, and the gate 40 extends lengthwise along the longitudinal axis 67 across a boundary 69 of the active device region 23. The protrusion 46 is positioned along a length of the gate 38 between the boundary 68 of the active device region 22 and the boundary 69 of the active device region 23. The protrusion 48 is positioned along a length of the gate 40 between the boundary 68 of the active device region 22 and the boundary 69 of the active device region 23. The boundary 68 of the active device region 22 may be directly adjacent to the boundary 69 of the active device region 23.

In an embodiment, the protrusions 46, 48 may be rectangular or substantially rectangular in shape. In an alternative embodiment, the protrusions 46, 48 may have rounded corners and a curved shape. The protrusion 46 may be formed with minimal distortion on the adjacent gate 41, and the protrusion 48 may be formed with minimal distortion on the adjacent gate 39, and the protrusions 46, 48 may exhibit minimal corner rounding.

Figure 6:
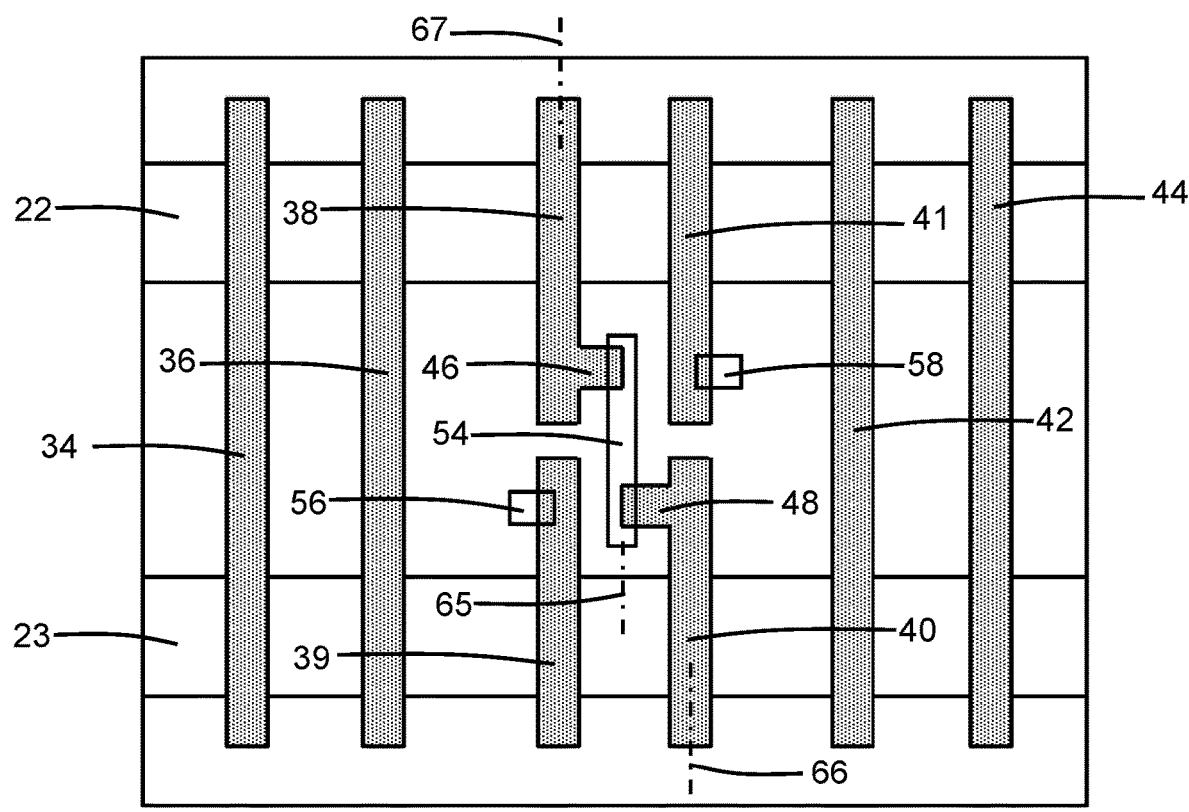
FIG. 6 is a top view of the structure at a fabrication stage subsequent to FIG. 5.

With reference to FIG. 6 in which like reference numerals refer to like features in FIG. 5 and at a subsequent fabrication stage, the gates 38, 40 may be further processed to form one of the inverters for a cross-couple. In an embodiment, the gate 38 and the gate 41 on one side of the gaps 50, 52 may belong to p-type field-effect transistors 70, 72, and the gate 39 and the gate 40 on the opposite side of the gaps 50, 52 may belong to n-type field-effect transistors 74, 76. Source/drain regions 51 for the p-type field-effect transistors 70, 72 may be formed in the active device region 22, and source/drain regions 53 for the n-type field-effect transistors 74, 76 may be formed in the active device region 23. As used herein, the term "source/drain region" means a doped region of semiconductor material that can function as either a source or a drain of a field-effect transistor. The source/drain regions 51 may be formed by, for example, a masked ion implantation of a p-type dopant (e.g., boron) into the active device region 22, and the source/drain regions 51 may be formed by, for example, a masked ion implantation of an n-type dopant (e.g., arsenic or phosphorus) into the active device region 23.

A gate contact 54 may be formed to physically and electrically connect the protrusions 46, 48 and thereby to cross-couple the gate 38 associated with the p-type field-effect transistor 70 to the gate 40 associated with the n-type field-effect transistor 76 in an inverter. The staggered and spaced-apart locations of the protrusions 46, 48 promote the ability of the gate contact 54 to land and thereby form the cross-couple between the gate 38 and the gate 40. The gate contact 54 may extend along a longitudinal axis 65 that is either parallel or substantially parallel to the longitudinal axis 66 of the gate 38 and that is either parallel or substantially parallel to the longitudinal axis 67 of the gate 40. Additional gate contacts 56, 58 may be formed that are connected to the gate 39 of the n-type field-effect transistor 76 and the gate 41 of the p-type field-effect transistor 72, and these gate connects may be connected in an overlying metallization level to form the other cross-couple of the inverter.

The gate contacts 54, 56, 58 may be comprised of a metal, such as tungsten, and may be formed by middle-of-line processing in a dielectric layer formed over the field-effect transistors. The dielectric layer may be comprised of a dielectric material, such as silicon dioxide, that is an electrical insulator. The dielectric material of the dielectric layer may fill the space between the protrusion 46 and the directly adjacent sidewall 63 of the gate 41, the space between the protrusion 48 and the directly adjacent sidewall 61 of the gate 39, and the spaces defined by the gaps 50, 52.

The protrusions 46, 48 are formed by a self-aligned double patterning process in which the mandrel 12 is manipulated by the formation of notches 24, 26 that lead to the formation of the protrusions 46, 48 in the gates 38, 40. The ability to use the protrusions 46, 48 for landing the gate contact 54 may permit the area of the inverter to be minimized without affecting the gate length printability and may improve pin accessibility because the cross-couple provided by the gate contact 54 is formed in a middle-of-line level of the interconnect structure. The protrusions 46, 48 may eliminate the need for a dummy gate when forming the cross-couples of the inverter, which may contribute to the area minimization.

Figure 7:
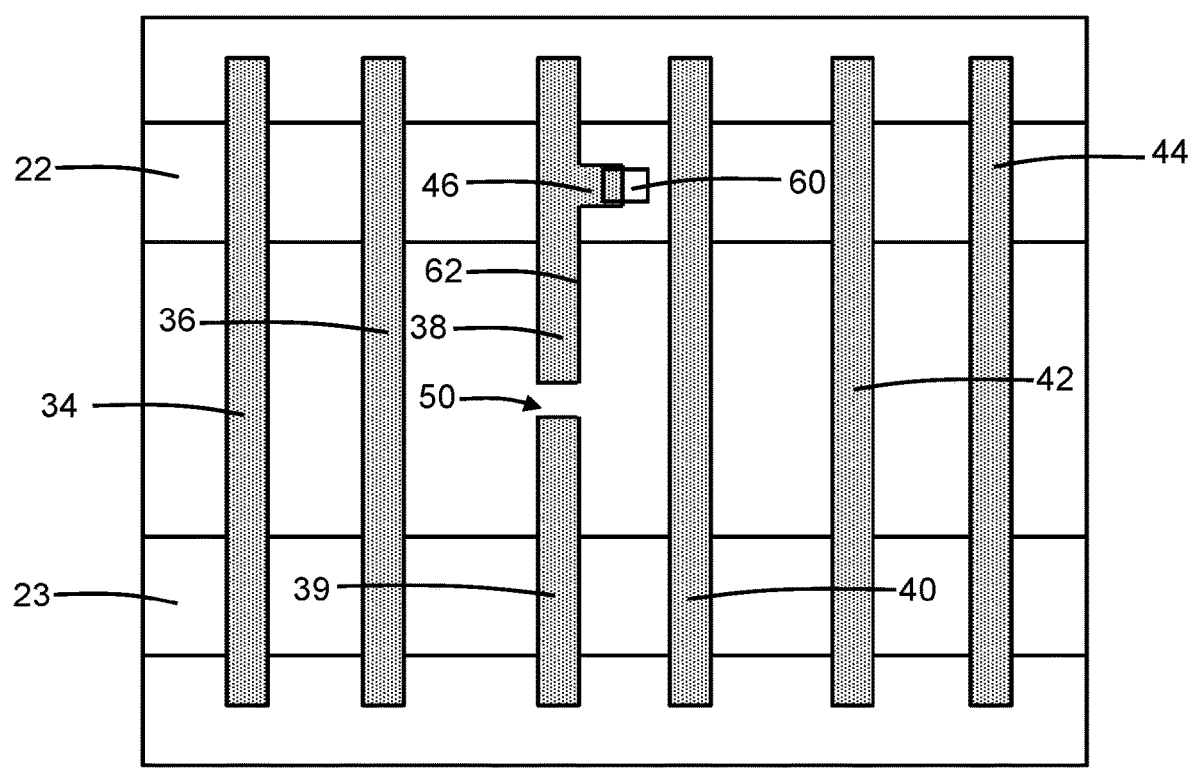
FIG. 7 is a top view of a structure in accordance with alternative embodiments of the invention.

With reference to FIG. 7 and in accordance with alternative embodiments, the protrusion 46 extending from the gate 38 may be located directly over the active device region 22. As a result, the protrusion 46 may overlap with the active device region 22. A gate contact 60, which is similar to the gate contacts 56, 58, may be formed that ties the gate 38 of the field-effect transistor to a source/drain region 51 (FIG. 5A) in the active device region 22. This configuration may be useful to tie off a gate terminal of the field-effect transistor to either power or ground, and to avoid the conventional lithography pinch point arising from the tight spacing between the gate contact and gate in conventional structures.

Figure 8:
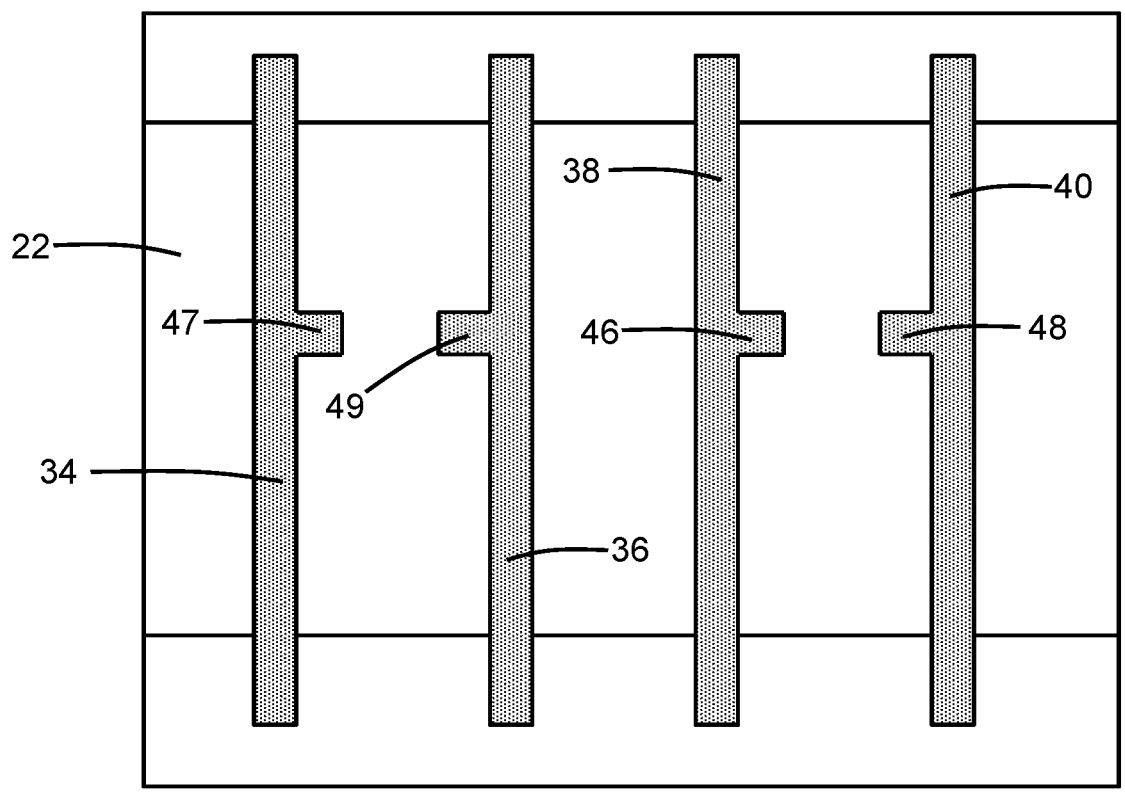
FIG. 8 is a top view of a structure in accordance with alternative embodiments of the invention.

With reference to FIG. 8 and in accordance with alternative embodiments, the gate 38 and the gate 40 may both extend across the active device region 22, the protrusion 46 projecting laterally from the gate 38 may be located along a length of the gate 38 to overlap with the active device region 22, and the protrusion 48 projecting laterally from the gate 38 may be located along a length of the gate 38 to overlap with the active device region 22. Gate contacts (not shown) may be formed that land on the protrusions 46, 48 over the active device region 22. The protrusions 46, 48 locally enlarge the size of the gates 38, 40 to facilitate the ability to land the gate contacts over the active device region 22. A similar set of protrusions 47, 49 may be provided on the gates 34, 36, and gate contacts (not shown) may be formed that land on the protrusions 47, 49 over the active device region 22. In an embodiment, the gates 34, 36 and the gates 38, 40 may be gate fingers of a switch field-effect transistor deployed in a radiofrequency application. Placing the gate contacts directly over the gates 34, 36 and the gates 38, 40 within the active device region 22 of a field-effect transistor may be effective to reduce the gate resistance for radiofrequency applications.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a first field-effect transistor including a first gate and a first protrusion projecting laterally from the first gate;
a second field-effect transistor including a second gate and a second protrusion projecting laterally from the second gate, the second gate and the second protrusion spaced in a lateral direction from the first gate and the first protrusion; and a gate contact connecting the first protrusion of the first gate to the second protrusion the second gate.

2. The structure of claim 1 wherein the first gate of the first field-effect transistor extends across a first boundary of a first active device region, the second gate of the second field-effect transistor extends across a second boundary of a second active device region, and the first protrusion is positioned along a length of the first gate between the first boundary of the first active device region and the second boundary of the second active device region.

3. The structure of claim 2 wherein the second protrusion is positioned along a length of the second gate between the first boundary of the first active device region and the second boundary of the second active device region.

4. The structure of claim 1 wherein the first field-effect transistor is an n-type field-effect transistor, and the second field-effect transistor is a p-type field-effect transistor.

5. The structure of claim 1 wherein the first gate has a first sidewall, the second gate has a second sidewall, the first protrusion projects laterally outward from the first sidewall, and the second protrusion projects laterally outward from the second sidewall.

6. The structure of claim 5 further comprising:
a third field-effect transistor including a third gate that is longitudinally aligned with the second gate,
wherein the first protrusion projects laterally outward from the first sidewall of the first gate toward the third gate, and the first protrusion is separated from the third gate by a first gap.

7. The structure of claim 6 further comprising:
a fourth field-effect transistor including a fourth gate that is longitudinally aligned with the first gate,
wherein the second protrusion projects laterally outward from the second sidewall of the second gate toward the fourth gate, and the second protrusion is separated from the fourth gate by a second gap.

8. The structure of claim 7 wherein the first field-effect transistor and the third field-effect transistor are n-type field-effect transistors, and the second field-effect transistor and the fourth field-effect transistor are p-type field-effect transistors.

9. The structure of claim 1 wherein the first gate is longitudinally aligned substantially parallel to the second gate, and the gate contact is longitudinally aligned substantially parallel to the first gate and the second gate.

10. The structure of claim 1 further comprising:
a third field-effect transistor including a third gate, the third gate longitudinally aligned with the first gate, the first gate and the third gate separated by a gap, and a portion of the first gate positioned between the first protrusion and the gap.

11. A method comprising:
forming a mandrel on a gate stack;
patterning a first notch extending from a first sidewall of the mandrel partially across a width of the mandrel;
forming a spacer adjacent to the first sidewall of the mandrel and a second sidewall of the mandrel, wherein the first notch is filled by a dielectric material of the spacer; and patterning the gate stack using the spacer and the dielectric material in the first notch as a first etch mask to respectively form a first gate and a first protrusion projecting laterally from a first sidewall of the first gate.

12. The method of claim 11 further comprising:
patterning a second notch extending from the second sidewall of the mandrel partially across the width of the mandrel,
wherein the spacer is formed adjacent to the second sidewall of the mandrel, and the second notch is filled by the dielectric material of the spacer.

13. The method of claim 12 further comprising:
patterning the gate stack using the spacer and the dielectric material in the second notch as a second etch mask to respectively form a second gate and a second protrusion projecting laterally from a second sidewall of the second gate.

14. The method of claim 13 wherein the first gate extends across a first boundary of a first active device region, the second gate extends across a second boundary of a second active device region, and the first protrusion is positioned along a length of the first gate between the first boundary of the first active device region and the second boundary of the second active device region.

15. The method of claim 14 wherein the second protrusion is positioned along a length of the second gate between the first boundary of the first active device region and the second boundary of the second active device region.

16. The method of claim 13 wherein the first gate and the second gate extend across an active device region, the first protrusion is positioned along a length of the first gate over the active device region, and the second protrusion is positioned along a length of the second gate over the active device region.

17. The method of claim 13 further comprising:
forming a gate contact connecting the first protrusion of the first gate to the second protrusion the second gate.

18. The method of claim 17 wherein the first gate is longitudinally aligned substantially parallel to the second gate, and the gate contact is longitudinally aligned substantially parallel to the first gate and the second gate.

19. The method of claim 13 further comprising:
forming a third field-effect transistor including a third gate that is longitudinally aligned with the second gate,
wherein the first protrusion projects laterally outward from the first sidewall of the first gate toward the third gate, and the first protrusion is separated from the third gate by a first gap.

20. The method of claim 19 further comprising:
forming a fourth field-effect transistor including a fourth gate that is longitudinally aligned with the first gate,
wherein the second protrusion projects laterally outward from the second sidewall of the second gate toward the fourth gate, and the second protrusion is separated from the fourth gate by a second gap.

* * * * *